US009552991B2

(12) United States Patent
Matsudaira et al.

(10) Patent No.: US 9,552,991 B2
(45) Date of Patent: Jan. 24, 2017

(54) TRENCH VERTICAL NAND AND METHOD OF MAKING THEREOF

(71) Applicant: SanDisk Technologies, Inc., Plano, TX (US)

(72) Inventors: Akira Matsudaira, San Jose, CA (US); James Kai, Fremont, CA (US); Yuan Zhang, San Jose, CA (US); Vinod Purayath, Santa Clara, CA (US); Donovan Lee, Santa Clara, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 275 days.

(21) Appl. No.: 14/265,815

(22) Filed: Apr. 30, 2014

(65) Prior Publication Data

US 2015/0318298 A1    Nov. 5, 2015

(51) Int. Cl.
*H01L 27/115* (2006.01)
*H01L 21/311* (2006.01)
(Continued)

(52) U.S. Cl.
CPC ......... *H01L 21/28* (2013.01); *H01L 21/28273* (2013.01); *H01L 21/28282* (2013.01); *H01L 21/31111* (2013.01); *H01L 21/31144* (2013.01); *H01L 21/32133* (2013.01); *H01L 21/32139* (2013.01); *H01L 27/1157* (2013.01); *H01L 27/11524* (2013.01); *H01L 27/11556* (2013.01); *H01L 27/11582* (2013.01)

(58) Field of Classification Search
CPC .................. H01L 27/11524; H01L 27/11582; H01L 27/1156; H01L 21/32133; H01L 21/31111; H01L 21/28273
See application file for complete search history.

(56) References Cited

U.S. PATENT DOCUMENTS

| 5,897,354 A | 4/1999 | Kachelmeier |
|---|---|---|
| 5,915,167 A | 6/1999 | Leedy |

(Continued)

FOREIGN PATENT DOCUMENTS

WO    WO02/15277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Kimberly Rizkallah
*Assistant Examiner* — Mounir Amer
(74) *Attorney, Agent, or Firm* — The Marbury Law Group PLLC

(57) ABSTRACT

A method of making a monolithic three dimensional NAND string includes providing a stack of alternating first material layers and second material layers different from the first material layer over a substrate, etching the stack to form at least one trench in the stack, forming a blocking dielectric over a side wall of the at least one trench, forming a charge storage layer over the blocking dielectric in the at least one trench, forming a tunnel dielectric over the charge storage layer in the at least one trench and forming a semiconductor channel over the tunnel dielectric in the at least one trench.

7 Claims, 18 Drawing Sheets

(51) Int. Cl.
*H01L 21/3213* (2006.01)
*H01L 21/28* (2006.01)

(56) References Cited

U.S. PATENT DOCUMENTS

| | | | |
|---|---|---|---|
| 6,238,978 B1 | 5/2001 | Huster |
| 6,953,697 B1 | 10/2005 | Castle et al. |
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,187,936 B2 | 5/2012 | Alsmeier et al. |
| 8,198,672 B2 | 6/2012 | Alsmeier |
| 8,349,681 B2 | 1/2013 | Alsmeier et al. |
| 8,450,791 B2 | 5/2013 | Alsmeier |
| 2007/0158736 A1 | 7/2007 | Arai et al. |
| 2007/0210338 A1 | 9/2007 | Orlowski |
| 2007/0252201 A1 | 11/2007 | Kito et al. |
| 2008/0173928 A1* | 7/2008 | Arai .................. H01L 29/7926 257/316 |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0266606 A1 | 11/2011 | Park et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

\* cited by examiner

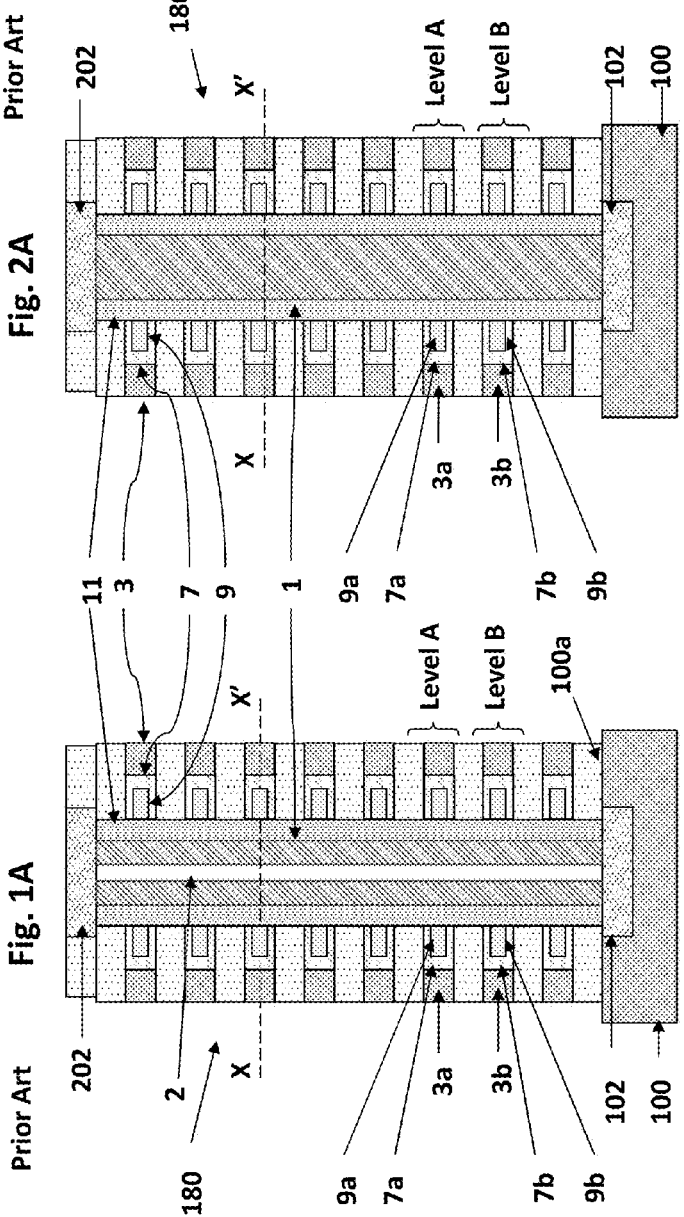

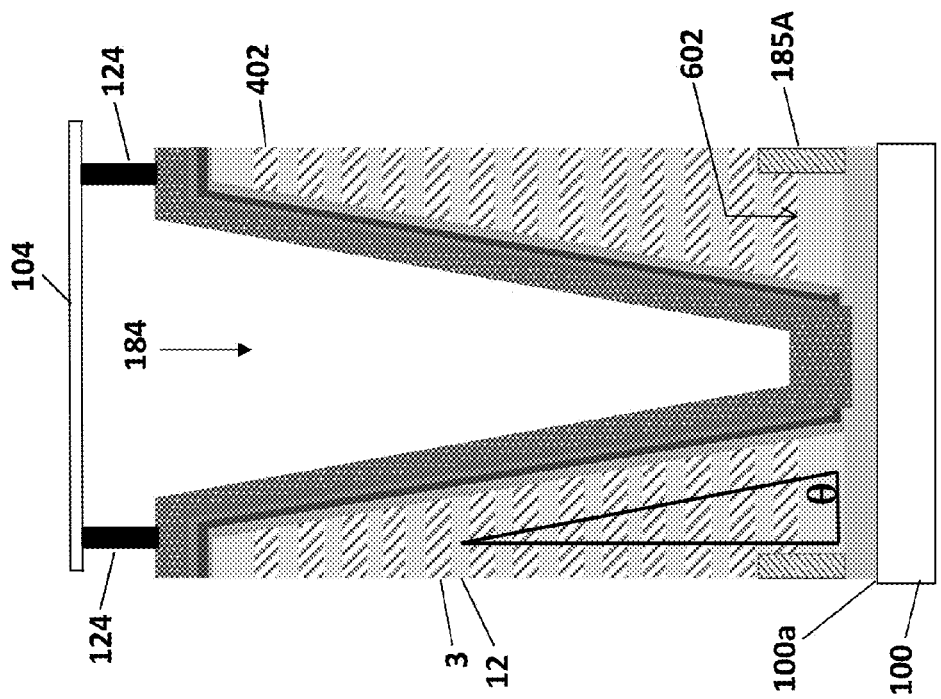
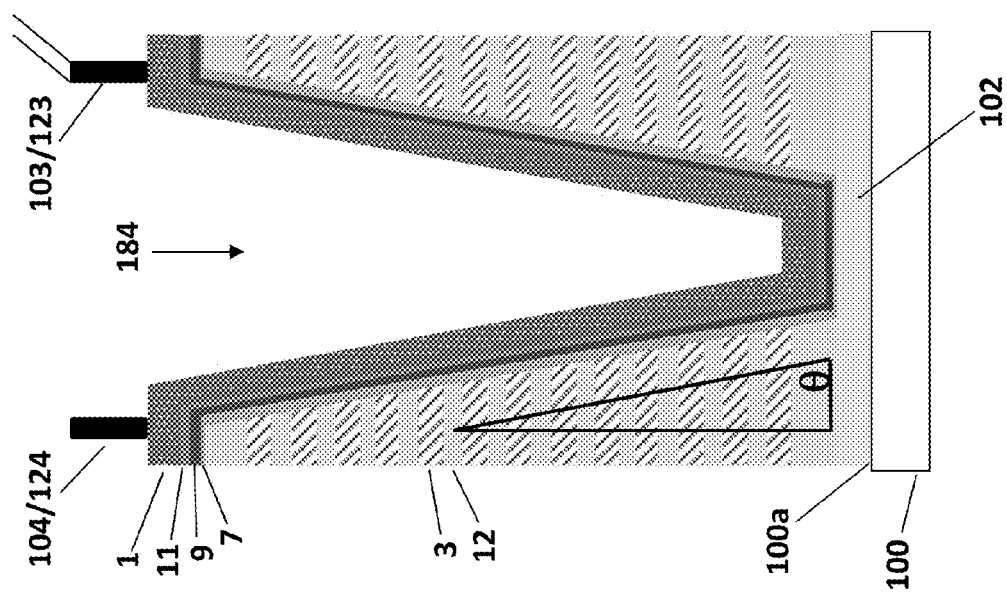
Fig. 6A
Fig. 6B

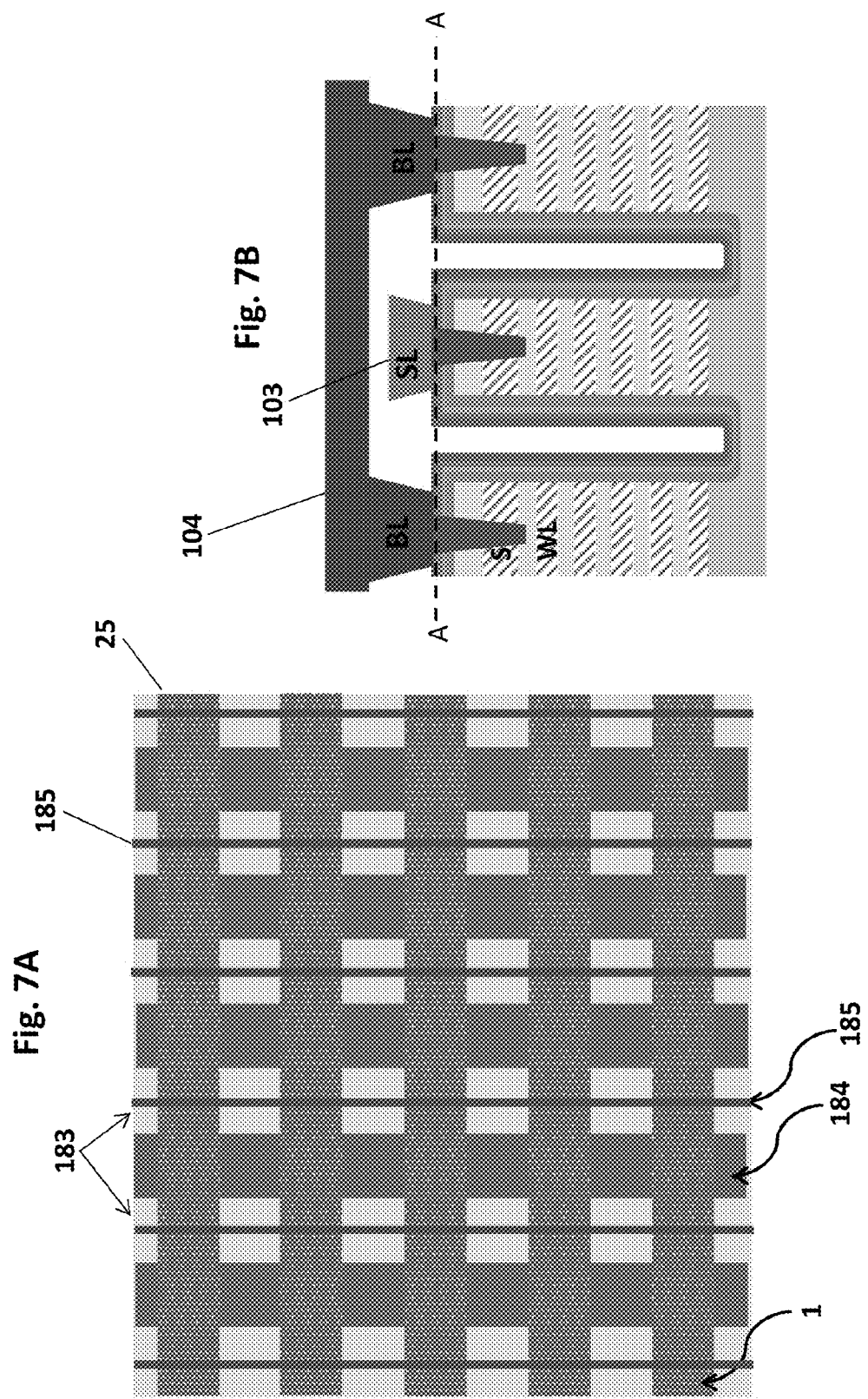

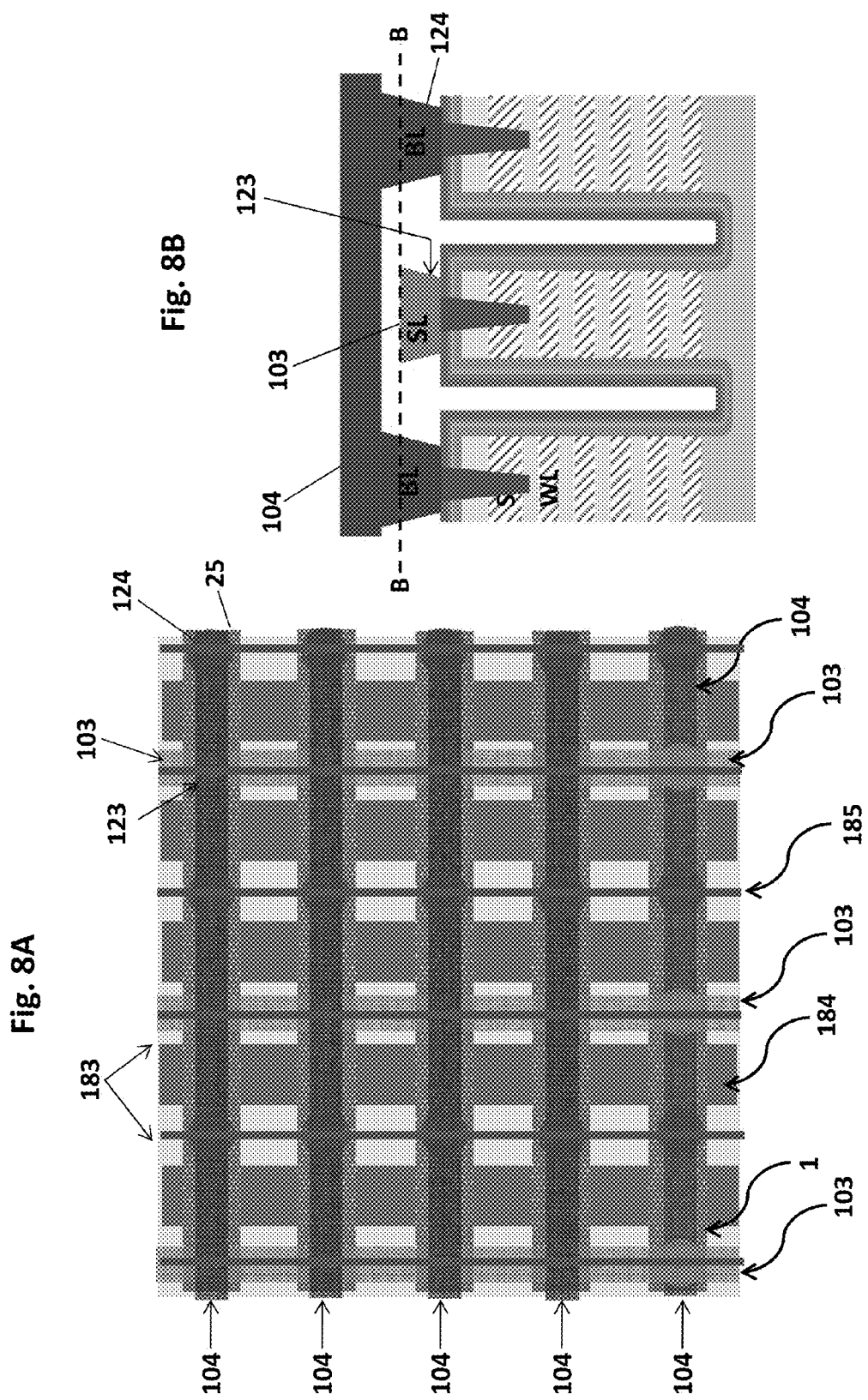

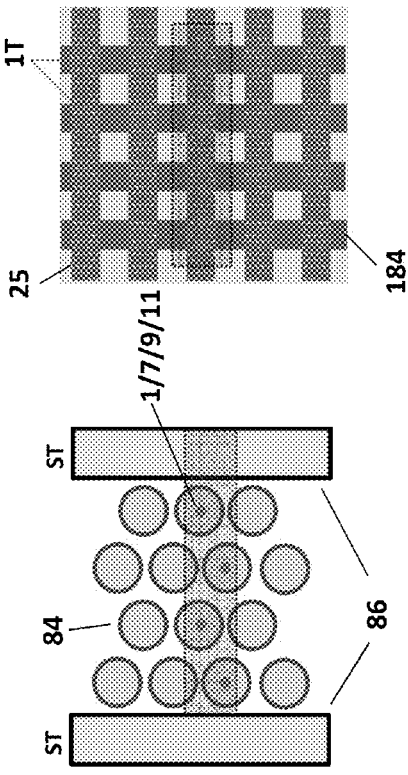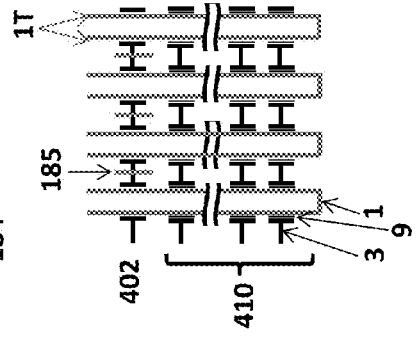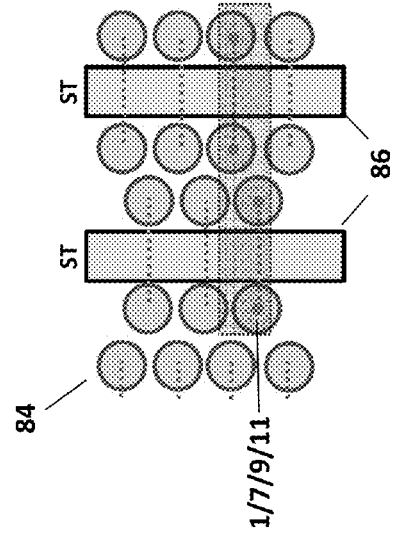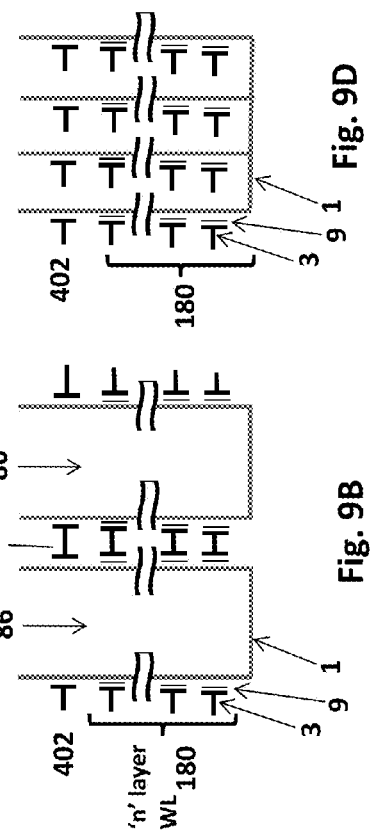

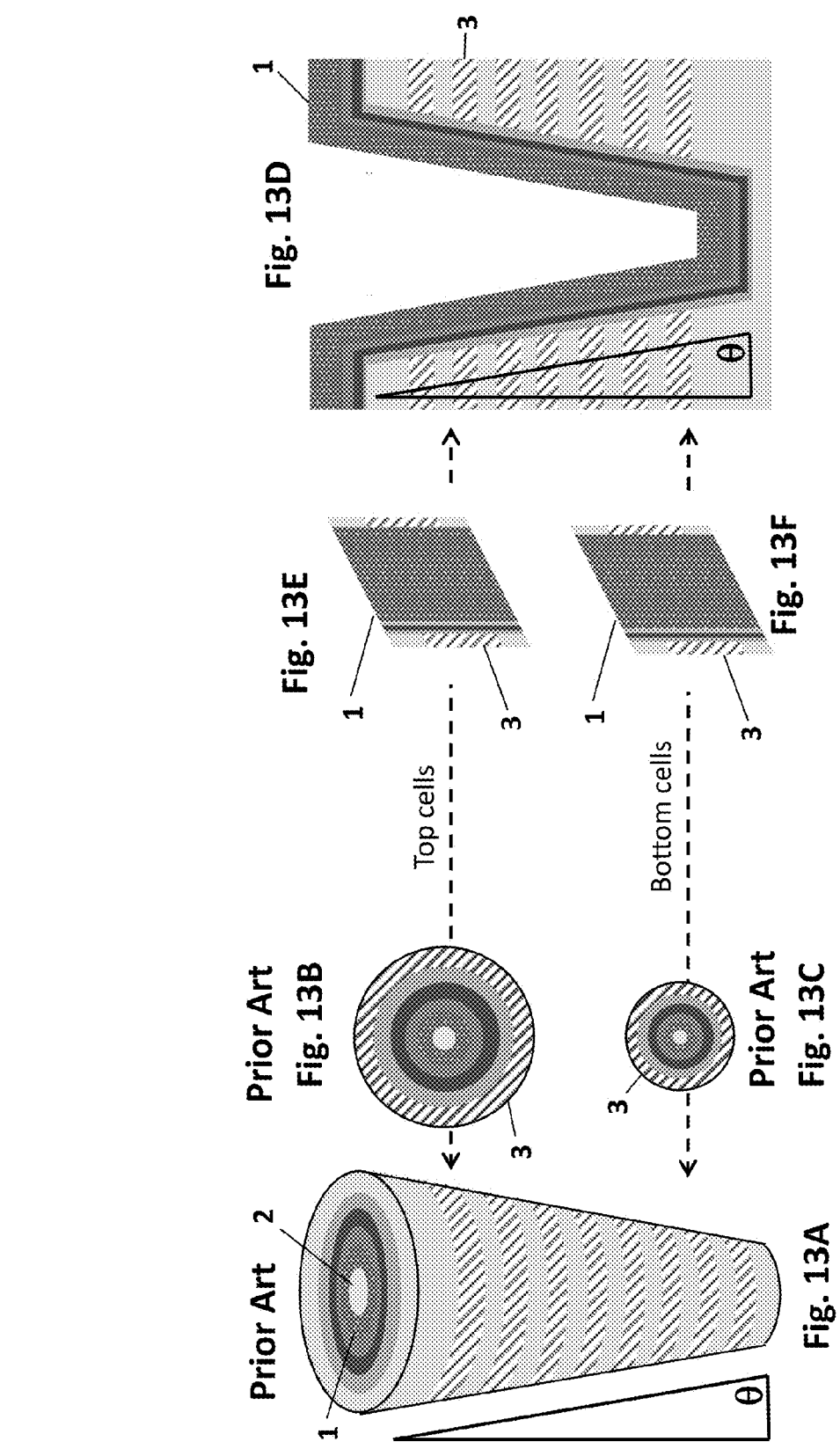

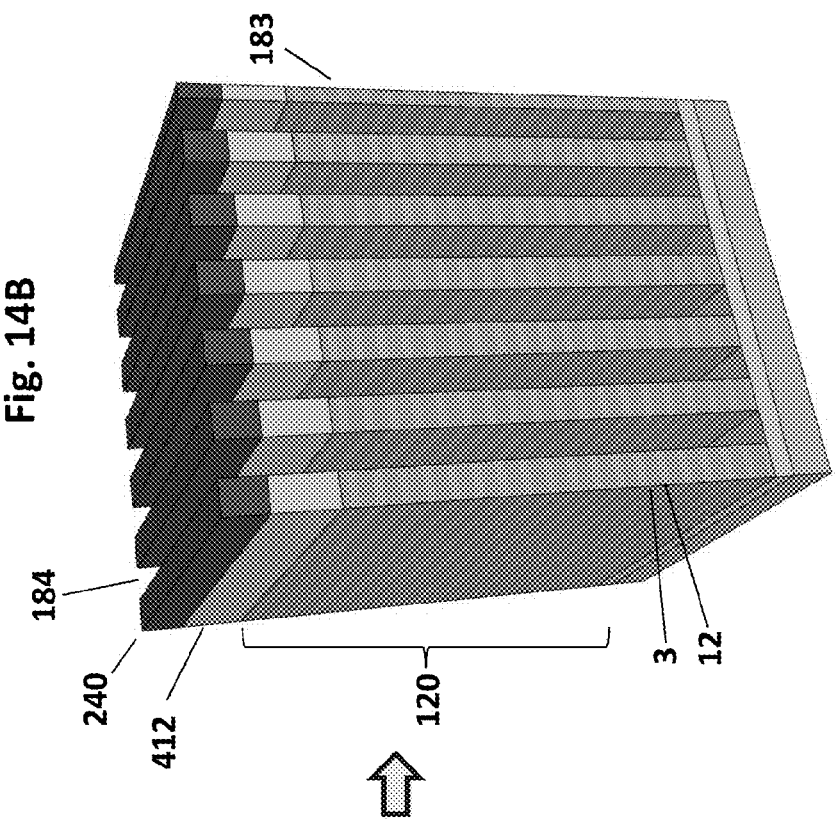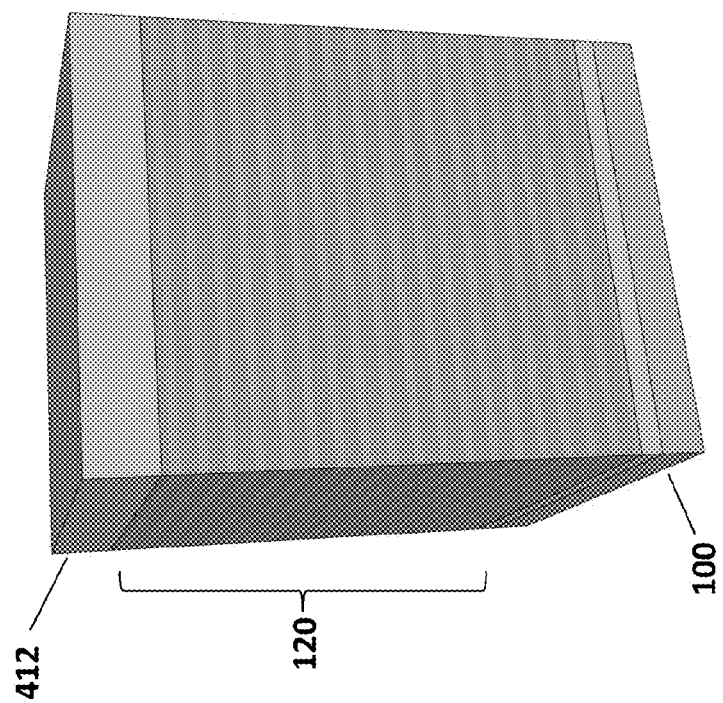

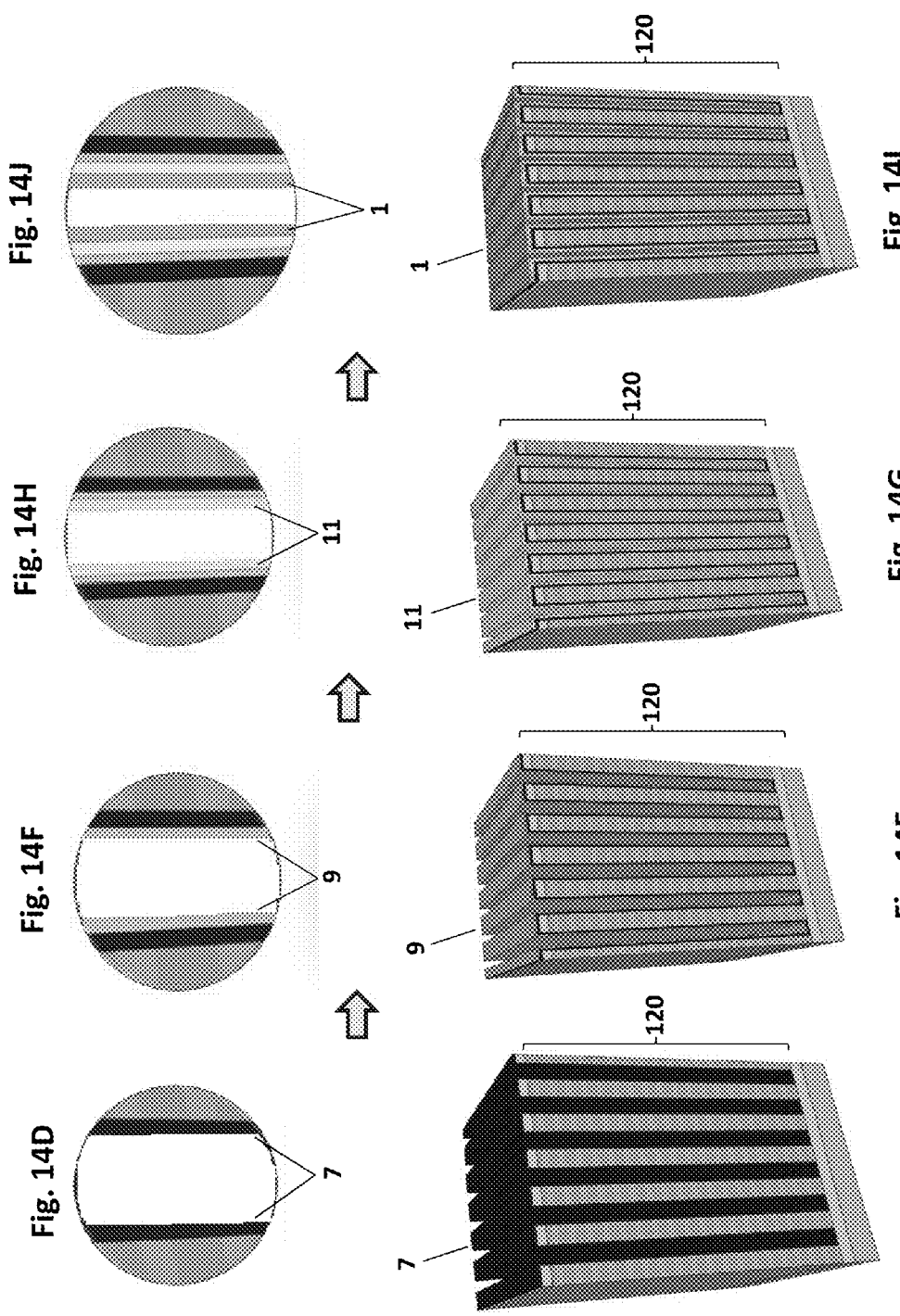

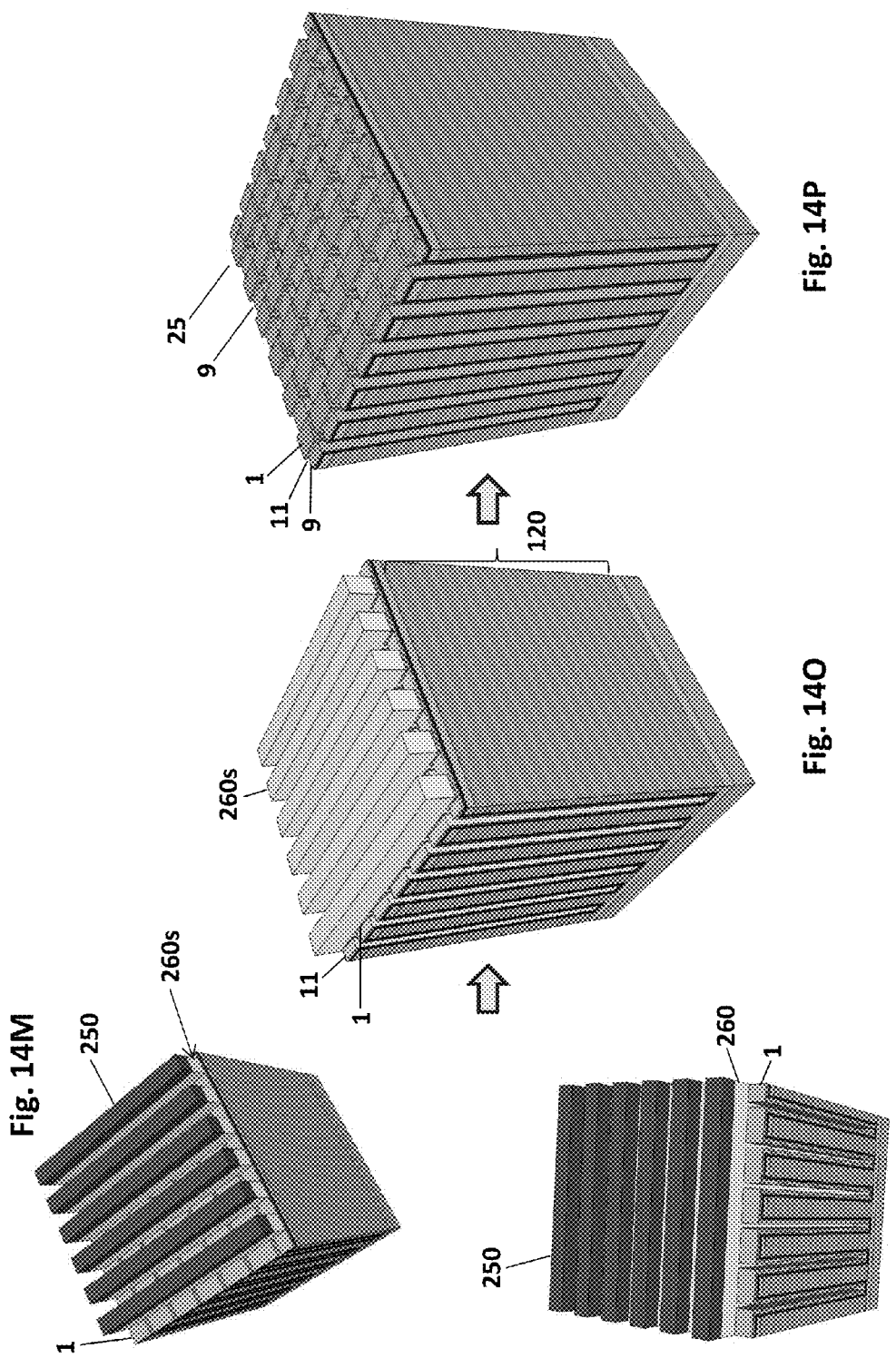

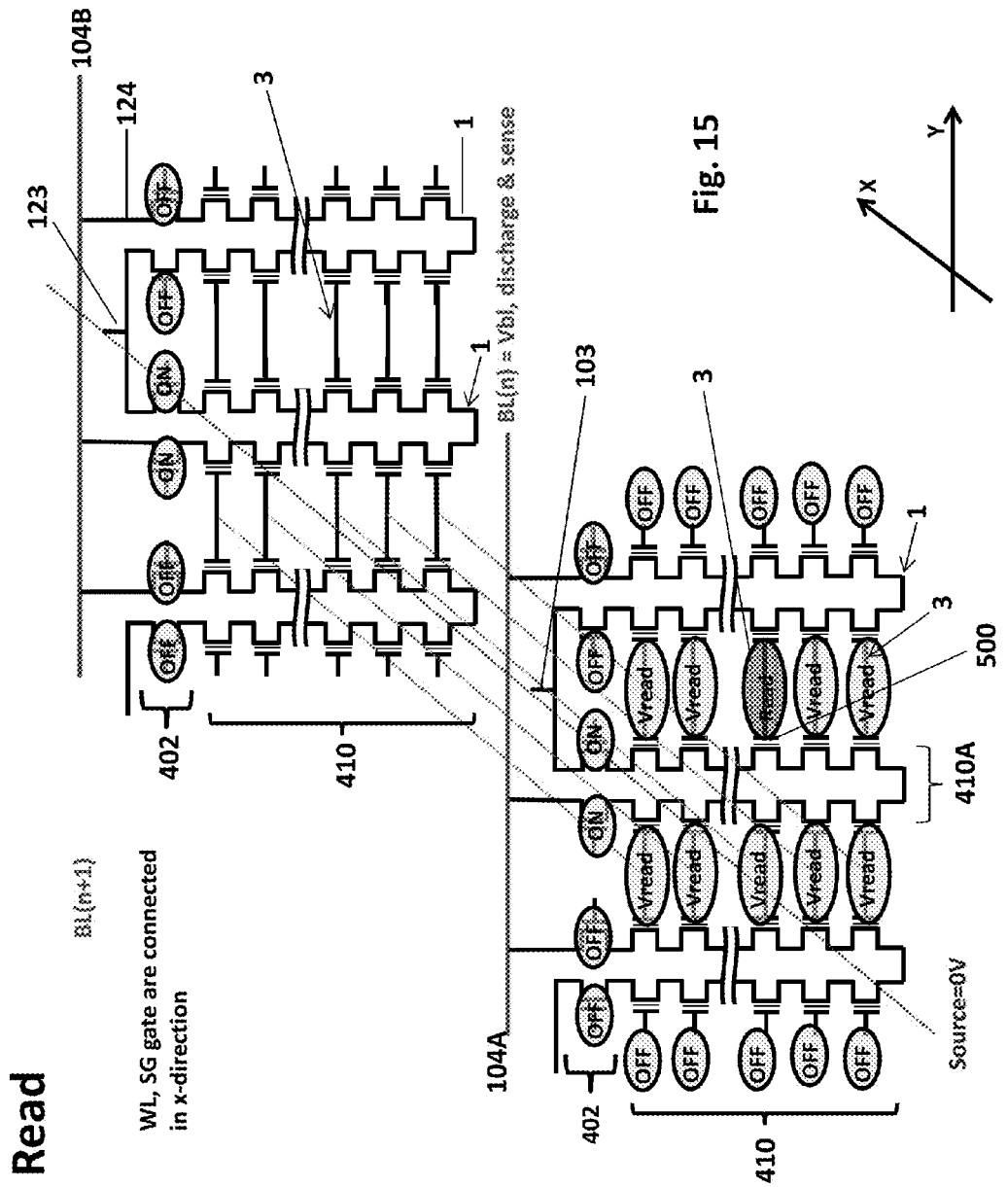

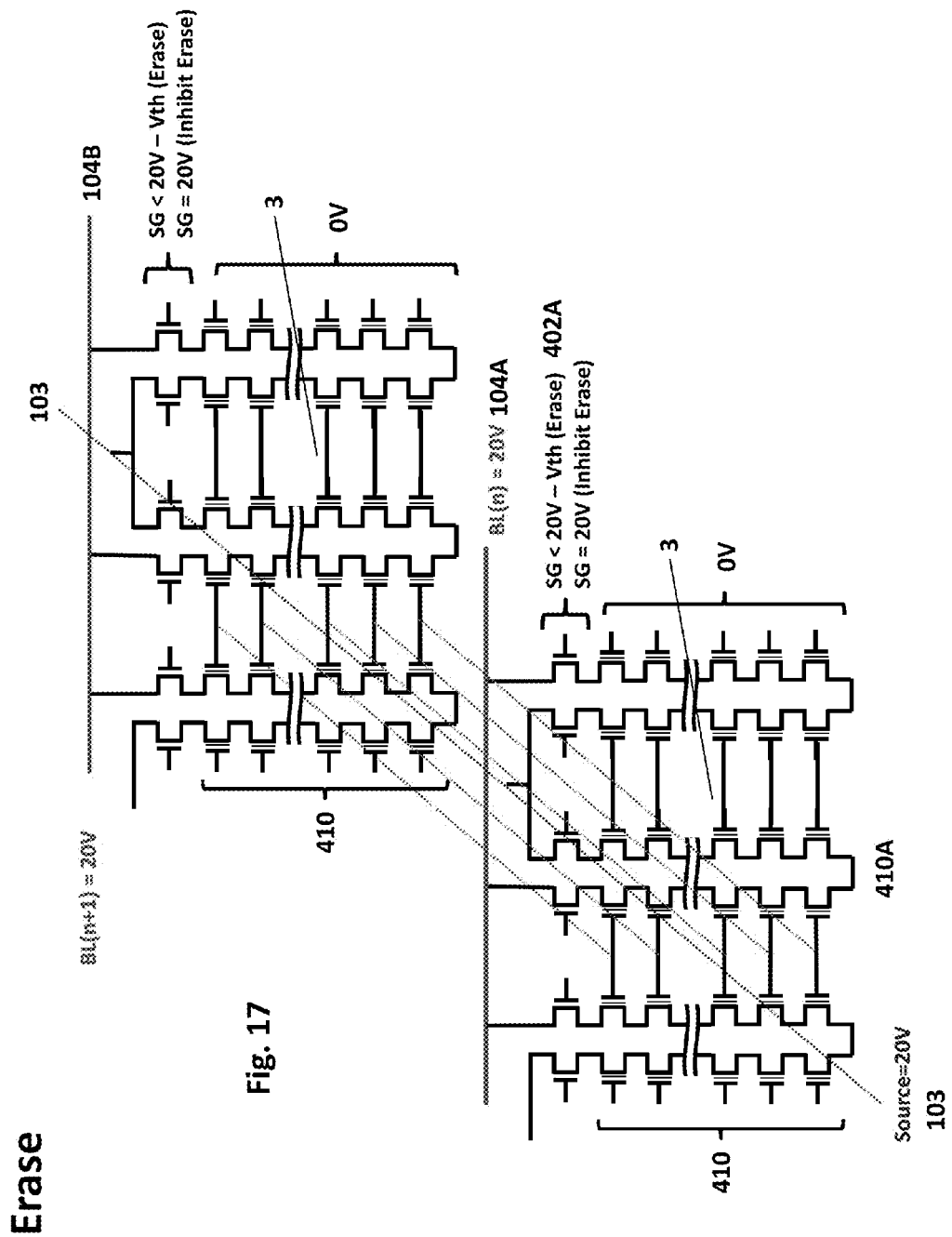

US 9,552,991 B2

TRENCH VERTICAL NAND AND METHOD OF MAKING THEREOF

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of making a monolithic three dimensional NAND string including providing a stack of alternating first material layers and second material layers different from the first material layer over a substrate, etching the stack to form at least one trench in the stack, forming a blocking dielectric over a side wall of the at least one trench, forming a charge storage layer over the blocking dielectric in the at least one trench, forming a tunnel dielectric over the charge storage layer in the at least one trench and forming a semiconductor channel over the tunnel dielectric in the at least one trench.

Another embodiment relates a monolithic three dimensional NAND string including a plurality of rails separated by a plurality of trenches, wherein each of the plurality of rails comprises stack of alternating insulating layers and electrically conductive control gate layers located over a major surface of a substrate, a semiconductor channel which extends over an upper surface of the plurality of rails and over a bottom surface and side walls of the plurality of trenches, wherein at least one portion of the semiconductor channel extends substantially perpendicular to the major surface of the substrate in at least one of the plurality of trenches, a blocking dielectric located in the plurality of trenches in contact with the plurality of control gate layers, a charge storage region located over the blocking dielectric and a tunnel dielectric located between the charge storage region and the semiconductor channel.

BRIEF DESCRIPTION OF THE DRAWINGS

FIGS. 1A and 1B are respectively side cross sectional and top cross sectional views of a conventional NAND string. FIG. 1A is a side cross sectional view of the device along line Y-Y' in FIG. 1B, while FIG. 1B is a side cross sectional view of the device along line X-X' in FIG. 1A.

FIGS. 2A and 2B are respectively side cross sectional and top cross sectional views of another conventional NAND string. FIG. 2A is a side cross sectional view of the device along line Y-Y' in FIG. 2B, while FIG. 2B is a side cross sectional view of the device along line X-X' in FIG. 2A.

FIGS. 6A and 6B are a side cross sectional views of NAND strings according to an embodiment.

FIG. 7A is a top cross sectional view through line A-A of FIG. 7B. FIG. 7B is a side cross sectional view of NAND strings according to an embodiment.

FIG. 8A is a top cross sectional view through line B-B of FIG. 8B. FIG. 8B is a side cross sectional view of NAND strings according to an embodiment.

FIGS. 9A and 9C are a plan views and FIGS. 9B and 9D are equivalent circuits of prior art vertical NAND memory devices.

FIG. 10A is a plan view and FIG. 10B is an equivalent circuit of a vertical NAND memory device according to an embodiment.

FIG. 13A is a perspective view and FIGS. 13B and 13C are top cross sectional views of a prior art NAND memory string.

FIG. 13D is a perspective view and FIGS. 13E and 13F are top cross sectional views of a NAND memory string according to an embodiment.

FIGS. 14A-C, 14E, 14G, 14I and 14K-14P are perspective views of steps in a method of making NAND strings according to an embodiment. FIGS. 14D, 14F, 14H and 14J are side cross sectional views of steps in the method of FIGS. 14A-C, 14E, 14G, 14I and 14K-14P.

FIG. 15 is a circuit diagram illustrating a read operation for a monolithic three dimensional NAND device according to an embodiment.

FIG. 17 is a circuit diagram illustrating an erase operation for a monolithic three dimensional NAND device according to an embodiment.

DETAILED DESCRIPTION

Embodiments of the invention are drawn to methods of making monolithic three dimensional NAND strings in trenches and the resulting devices. The methods allow for higher cell memory density, e.g. more cells per square centimeter of chips, than conventional pillar NAND strings. The cell density may be more than twice as much as conventional pillar NAND devices, such as $7.5 \times L \times 10^9$ or greater, such as $7.6 \times L \times 10^9$ to $3.78 \times L \times 10^{10}$ cells/cm$^2$ where L is number of device levels. In an embodiment, the NAND memory device has two memory strings per trench. In another embodiment, adjacent memory trenches are isolated from each other without the need to form slit trenches.

The inventors have determined that etching of high aspect ratio, elongated trenches is easier than etching cylindrical memory holes with a high aspect ratio. Further, the inventors have also found that the use of flat cells located in trenches allows a greater margin in the etching profiles. Additionally, the inventors have found that the threshold voltage of flat memory cells located in a trench is not affected by the etching profile. This is in contrast to the variable threshold voltage found in cells located in conventional cylindrical memory holes.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3A:
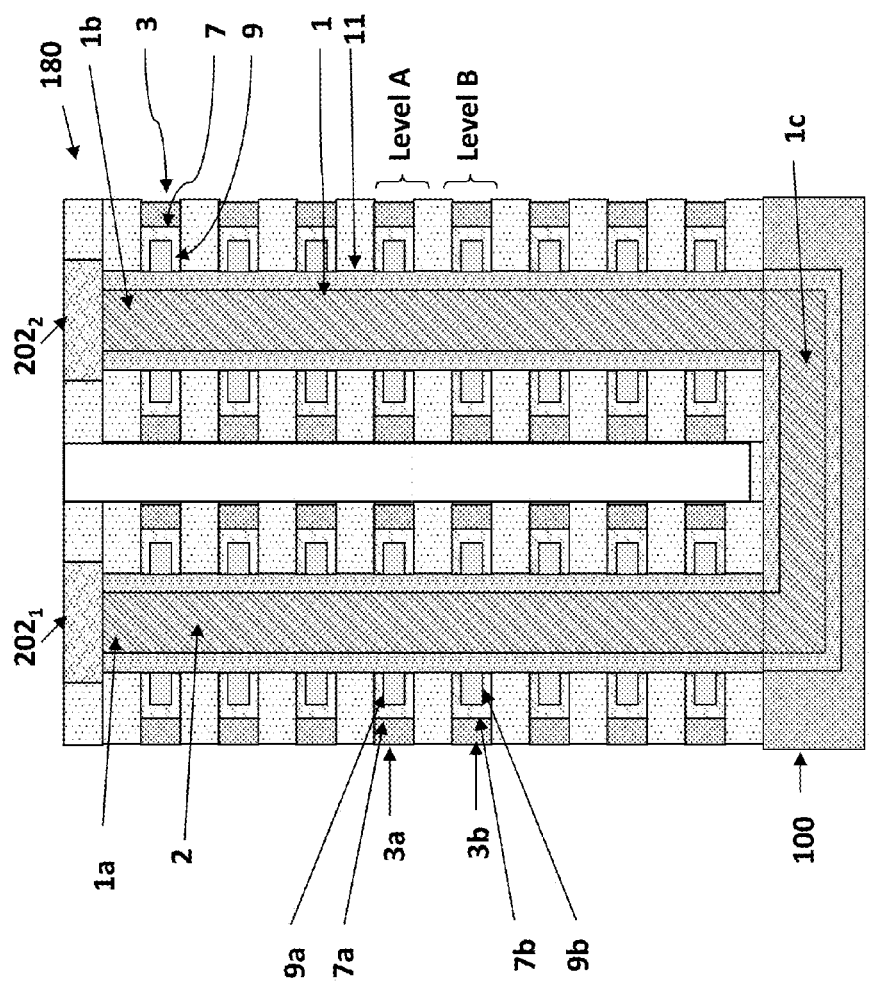
FIG. 3A is side cross sectional view of a conventional NAND string of an embodiment with a U-shaped channel.
Figure 3B:
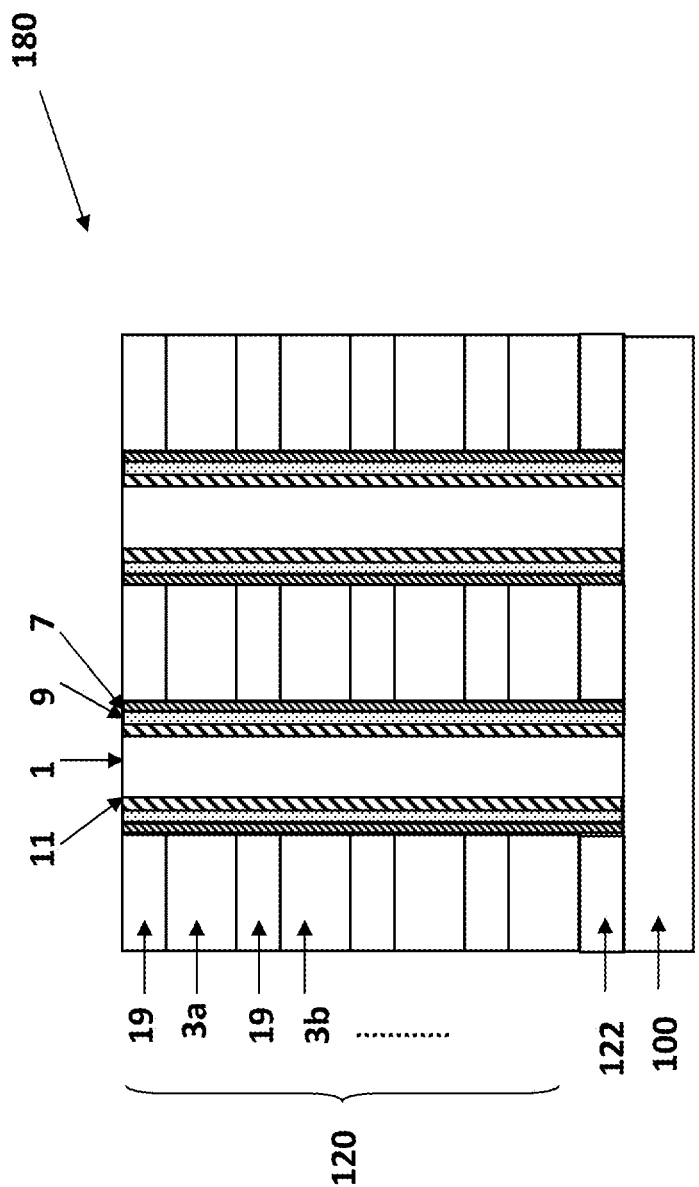
FIG. 3B is side cross sectional view of a conventional NAND string of an embodiment with a pillar-shaped channel.

In some embodiments, the monolithic three dimensional NAND string 180 comprises a semiconductor channel 1 having at least one end portion extending substantially perpendicular to a major surface 100a of a substrate 100, as shown in FIGS. 1A, 2A and 3B. "Substantially perpendicular to" (or "substantially parallel to") means within 0-10° of respective perpendicular or parallel direction. For example, the semiconductor channel 1 may have a pillar shape and the entire pillar-shaped semiconductor channel extends substantially perpendicularly to the major surface of the substrate 100, as shown in FIGS. 1A, 2A and 3B. In these embodiments, the source/drain electrodes of the device can include a lower electrode 102 provided below the semiconductor channel 1 and an upper electrode 202 formed over the semiconductor channel 1, as shown in FIGS. 1A and 2A.

Alternatively, the semiconductor channel 1 may have a U-shaped pipe shape, as shown in FIG. 3A. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1A-3B for clarity.

In some embodiments, the semiconductor channel 1 may be a filled feature, as shown in FIGS. 2A, 2B, 3A and 3B. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3A and/or the channel 1 shown in FIG. 3B may alternatively be a hollow cylinder filled with an insulating fill material 2, shown in FIGS. 1A-1B.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recyrstallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, 3A and 3B. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof. For example, the control gate material in FIGS. 1A, 2A and 3A may comprise a conductive metal or metal alloy, such as tungsten and/or titanium nitride, while the control gate material in FIG. 3B may comprise doped polysilicon.

A blocking dielectric 7 is located adjacent to the control gate(s) 3 and may surround the control gate 3, as shown in FIGS. 1A, 2A and 3A. Alternatively, a straight blocking dielectric layer 7 may be located only adjacent to an edge (i.e., minor surface) of each control gate 3, as shown in FIG. 3B. The blocking dielectric 7 may comprise a layer having plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIG. 3A. Alternatively, the blocking dielectric 7 may be a straight, continuous layer, as shown in FIG. 3B, similar to the device described in U.S. Pat. No. 8,349,681 issued on Jan. 8, 2013 and incorporated herein by reference in its entirety.

The monolithic three dimensional NAND string also comprise a charge storage region 9. The charge storage region 9 may comprise one or more continuous layers which extend the entire length of the memory cell portion of the NAND string, as shown in FIG. 3B. For example, the charge storage region 9 may comprise an insulating charge trapping material, such as a silicon nitride layer.

Alternatively, the charge storage region may comprise a plurality of discrete charge storage regions 9, as shown in FIGS. 1A, 2A and 3A. The plurality of discrete charge storage regions 9 comprise at least a first discrete charge storage region 9a located in the device level A and a second discrete charge storage region 9b located in the device level B, as shown in FIG. 3A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers).

Figure 4:
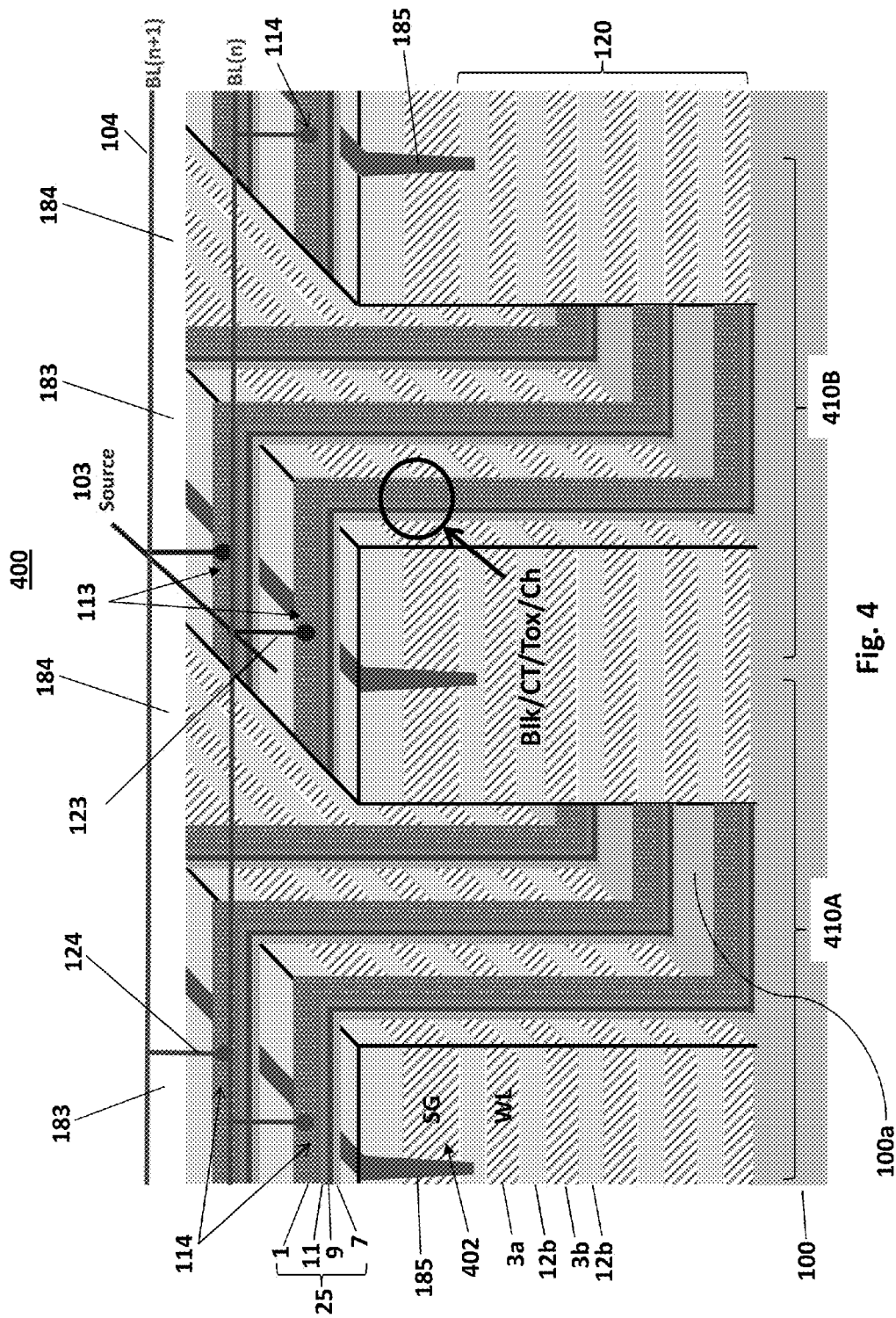
FIG. 4 is a perspective cross sectional view of a NAND device of according to an embodiment.
Figure 5:
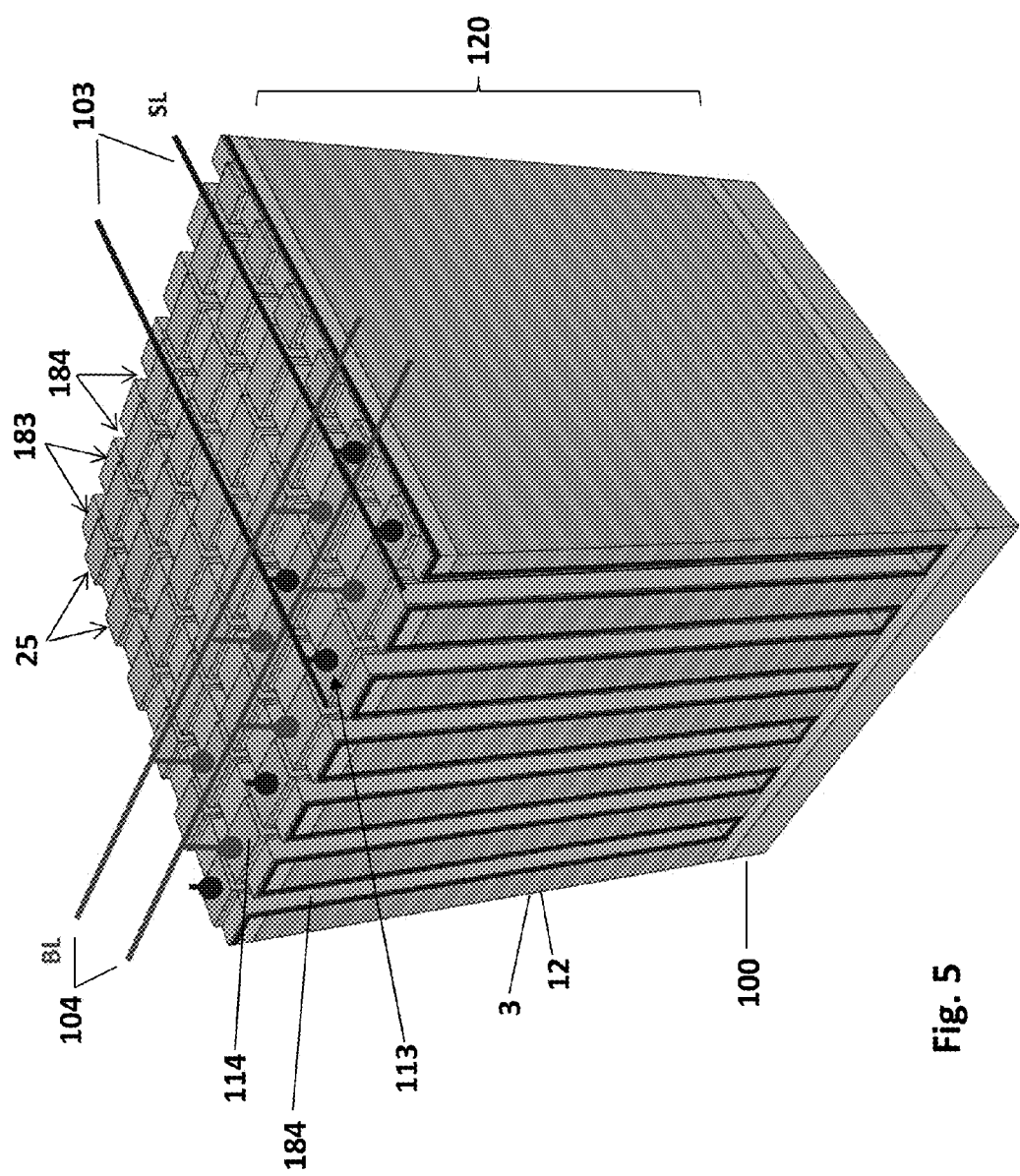
FIG. 5 is a perspective view of a NAND device of according to an embodiment.

FIGS. 4 and 5 illustrate a monolithic three dimensional NAND device 400 comprising a plurality of strings 410 (e.g. 410A, 410B) according to an embodiment. FIG. 4 is a perspective cross sectional view of the NAND device 400 while FIG. 5 is a perspective view of the NAND device 400. Embodiments of methods of making the NAND device 400 of FIG. 4 are discussed in more detail below. The NAND device 400 of the embodiment of FIG. 4 includes a stack 120 of alternating layers of first layers 12 and second layers 3 over a substrate 100. The first layers 12 comprise an electrically insulating material. Any suitable insulating material may be used, such as silicon oxide, silicon nitride, silicon oxynitride, a high-k dielectric (e.g., aluminum oxide, hafnium oxide, etc. or an organic insulating material). The second layers 3 comprise a conductive (e.g., metal or metal alloy) or semiconductor (e.g., heavily doped n+ or p+ polysilicon) control gate material.

The monolithic three dimensional NAND device 400 includes a plurality of rails 183 containing layers 3, 12 of the stack 120 separated by memory trenches 184 etched through the stack 120 of alternating layers of first layers 12 and second layers 3. The monolithic three dimensional NAND string 410 (e.g. 410A, 410B, etc. of the device 400) also includes a semiconductor channel 1 which extends over the upper surface of the plurality of rails 183 and over the bottom surface and the side walls of the memory trenches 184. In this embodiment, at least one portion of the semiconductor channel 1 extends substantially perpendicular to the major surface 100a of the substrate 100 in at least one of the trenches 184. Each monolithic three dimensional NAND 410 string further includes a blocking dielectric 7 located in the trenches 184 and in contact with the control gate layers 3. Each monolithic three dimensional NAND string 410 also includes a charge storage region 9 located over the blocking dielectric 7 and a tunnel dielectric 11 located between the charge storage region 9 and the semiconductor channel 1.

In an embodiment, the charge storage region 9 comprises a charge storage layer, such as a charge storage dielectric (e.g. silicon nitride), the rails 183 and the memory trenches 184 extend in a first direction, the control gate layers 3 comprise a plurality of control gate electrodes 3 that extend in a second direction substantially parallel to the major surface 100a of the substrate 100. Preferably, the second direction is substantially perpendicular to the first direction. The control gate electrodes 3 comprise at least a first control gate electrode 3a located in a first device level and a second control gate electrode 3b located in a second device level located over the major surface of the substrate 100 and below the first device level.

In an embodiment, the blocking dielectric 7, the charge storage layer 9, the tunnel dielectric 11 and the semiconductor channel 1 comprise a plurality of strips 25 extending in the second direction which is substantially perpendicular to the first direction (e.g. in a direction parallel to the direction of the control gates 3). In an alternative embodiment, only the channel 1 is provided in the shape of a strip 25 (while the blocking dielectric 7, the charge storage layer 9, the tunnel dielectric 11 are provided as continuous layers). In another alternative embodiment, only the tunnel dielectric 11 and the semiconductor channel 1 are etched into strips 25. In another alternative embodiment, only the charge storage layer 9, the tunnel dielectric 11 and the semiconductor channel 1 are etched into strips 25.

In an embodiment, the channels 1 are etched in the shape of strips 25 extending in a direction which is substantially perpendicular to the direction of the rails 183. In this embodiment (as discussed in more detail below in regards to FIGS. 14A-14P), the plurality of trenches 184 are filled with a sacrificial material 260 after the step of forming the semiconductor channel and before the step of etching that forms the plurality of strips 25. Next a mask 250 is formed which comprises a plurality of strips extending in the second direction (perpendicular to the rails 183) over the sacrificial layer 260. The sacrificial material 260 is etched using the mask 250 to form a plurality of sacrificial strips 260s. The step of etching to form the plurality of strips 25 may further comprise etching the semiconductor channel 1 using the sacrificial strips 260s (before or after removing the mask 250) to form the plurality of strips 25. After forming the strips 25 of channel 1, the mask 250 and the sacrificial strips 260s may be removed. In an alternative embodiment, the step of etching to form the plurality of strips 25 may further comprise etching the tunnel dielectric 11 and the semiconductor channel 1 using the sacrificial strips 260s to form the plurality of strips 25. In another alternative embodiment, the step of etching to form the plurality of strips 25 may further comprise etching the charge storage layer 9, the tunnel dielectric 11 and the semiconductor channel 1 using the sacrificial strips 260s to form the plurality of strips 25.

As illustrated in FIG. 4, the monolithic three dimensional NAND string includes a plurality of bit lines 104 that extend in the second direction. The bit lines 104 electrically contact doped regions 114 (e.g. drain regions) in the channel region 1 in each of the strips 25. The monolithic three dimensional NAND string also includes a plurality of source lines 103 that extend in the first direction above or below the strips 25 and electrically contact the doped regions 113 (e.g. source regions) in the semiconductor channel 1 in each of the strips 25. Optionally, the drain and source electrodes 124, 123 connect the bit lines 104 and the source lines 103 with the doped regions 114, 113, respectively. Alternatively, the bit lines 104 and the source lines 103 can directly physically contact the doped regions 114, 113. The doped regions 113, 114 are doped to be the opposite conductivity type from the rest of the semiconductor channel 1.

In an embodiment, the monolithic three dimensional NAND string, further includes a slit trenches 185 located in each respective one of the rails 183. Optionally, the slit trenches 185 may be filled with an insulating material.

In an embodiment, the rails 183 further include at least one of electrically conductive select gate layers 402. In an embodiment, the slit trenches 185 are formed the select gate layers 402 in each of the rails 183, such that slit trenches 185 do not extend through the control gate layers.

In another embodiment illustrated in FIG. 6A, the monolithic three dimensional NAND string includes a back gate 102 located in or over the major surface 100a of the substrate 100 but below the trenches 184 and below the rails 183. In this embodiment, a bottom portion of the semiconductor channel 1 is doped the same conductivity type as the rest of the channel 1 but with a higher doping concentration.

In another embodiment illustrated in FIGS. 6A and 6B, each of the trenches 184 has a bottom proximal to the major surface of the substrate 100 and a top distal from the major surface 100a of the substrate 100 and each of the trenches 184 is wider at the top than at the bottom. In an embodiment, the side walls of each of the trenches 184 are tapered at an angle θ between 80 and 90 degrees relative to the major surface 100a (e.g. the horizontal surface) of the substrate 100.

In one embodiment, the strips 25 extend continuously over an upper surface of the rails 183 containing slit trenches 185 filled with the insulating material and over a bottom surface and side walls of the memory trenches 184. In another embodiment shown in FIGS. 7A, 7B, the slit trenches 185 filled with the insulating material extend through the strips 25 at the upper surface of the rails 183. In this embodiment, the strips 25 contain a discontinuity that includes a respective one of the slit trenches 185 filled with the insulating material over an upper surface of the rails 183. In another embodiment as illustrated in FIG. 7B, each of the bit lines 104 contacts adjacent portions of the semiconductor channel 1 separated by a respective one of the slit trenches 185 filled with the insulating material to form a conductive bridge between the adjacent portions of the semiconductor channel 1.

In the above embodiments, the source lines 103 are located above the strips 25 and electrically contact the semiconductor channel 1 (e.g. doped source regions 113 in the channel 1) in each of the strips 25 from above. In an embodiment as illustrated in FIG. 6B, the common source lines 103 are located in or above the major surface 100a of the substrate 100 below each of the memory trenches 184 below the control gate electrodes. The source lines 103 electrically contact the semiconductor channel 1 in each of the strips 25 from below (e.g. at the bottom of the memory trenches 184). As illustrated in FIG. 6B, the source side gate electrode 602 is located below the control gates 3 and the drain side select gate 402 is located above the control gates 3 in each of the rails 183. A lower slit trench 185A located below the stack extends through the source side select gate electrode 602.

FIGS. 7A-8B illustrate top cross sectional and side cross sectional views of a monolithic three dimensional NAND string according to an embodiment. FIG. 7A illustrates the top cross sectional view through line A-A of FIG. 7B while FIG. 8A illustrates the top cross sectional view through line B-B of FIG. 8B. As illustrated in FIG. 7A, the channels 1 are arrayed as strips 25 extending in a direction perpendicular to the rails 183. Further, as illustrated in FIG. 7B, the strip 25 shaped channels 1 run across the rails 183, over the slit trenches 185, down the sidewalls and over the bottom of the memory trenches 184. The channels 1 may run over the slit trenches 185 as shown in FIGS. 4 and 5 or are interrupted by the slit trenches 185 as shown in FIGS. 7A, 7B.

FIGS. 8A and 8B show the same device as FIGS. 7A and 7B. However, the top cross sectional view illustrated in FIG. 8A is taken through a slice B-B through the bit line 104, just above the source line 103. Thus, FIG. 8A illustrates the pattern of the source lines 103 and the bit lines 104 for the monolithic three dimensional NAND strings. As illustrated, the source lines 103 are located on the rails 183 and run along (e.g. are substantially parallel to) the rails 183. In contrast, the bit lines 104 are oriented substantially perpendicularly to the rails 183 and are located above the strip 25 shaped channels 1. The connections of the source lines 103 and the bit lines 104 with the strip 25 shaped channels 1 are indicated by the optional electrodes 123, 124, respectively in FIG. 8A.

FIGS. 9A and 9C are a plan views prior art vertical NAND memory devices. FIGS. 9B and 9D are equivalent circuits of the devices illustrated in FIGS. 9A and 9C, respectively. The device illustrated in FIGS. 9A, 9B corresponds to the conventional NAND device illustrated in FIG. 3. This device has cylindrical memory holes 84 and a "U" shaped channel 1. Further, this conventional NAND device requires a slit trench 86 between the wings 1a, 1b of the channel to prevent the control gates 3 of the opposing wings 1a, 1b from shorting each other. The conventional NAND device illustrated in FIGS. 9C, 9D corresponds to the NAND devices illustrated in FIGS. 1 and 2. This NAND device has cylindrical memory holes 84 configured as pillars. As described in more detail in U.S. Pat. No. 8,349,681, hereby incorporated by reference in its entirety, this NAND device also includes slit trenches 86 to prevent the control gates of adjacent NAND strings from shorting with each other.

FIGS. 10A and 10B illustrate a plan view and equivalent circuit, respectively of a vertical NAND memory device according to an embodiment. The device illustrated in FIGS. 10A, 10B does not require slit trenches 86 as in the conventional NAND devices. Further, for this NAND device, source lines 103 are only provided on every other rail 183 in contact with source regions at top parts 1T of the channel 1 (also shown in FIGS. 5 and 8A). This allows the device illustrated in FIGS. 10A, 10B to have two memory strings per memory trench 184 as discussed in more detail in regards to FIGS. 11A and 11B below.

Figure 11A:
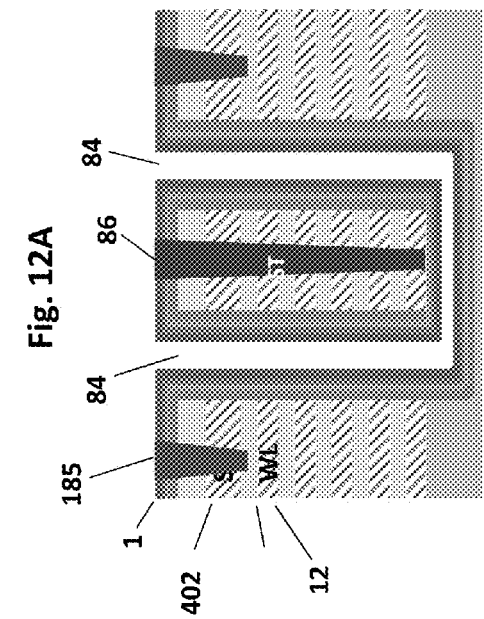
FIG. 11A is a side cross sectional view and FIG. 11B is an equivalent circuit of a vertical NAND memory device according to an embodiment.
Figure 11B:
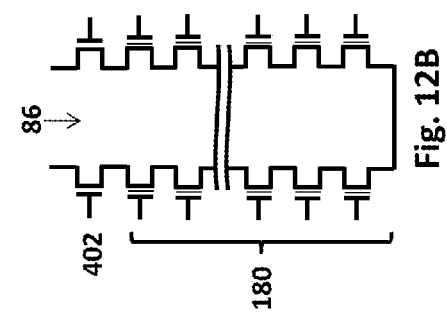
Figure 12A:
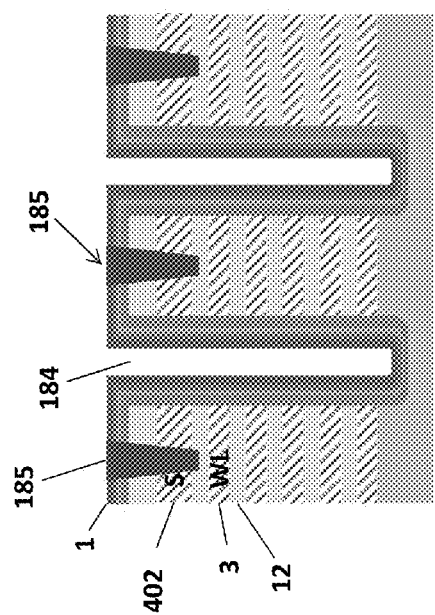
FIG. 12A is a side cross sectional view and FIG. 12B is an equivalent circuit of a prior art vertical NAND memory device.
Figure 12B:
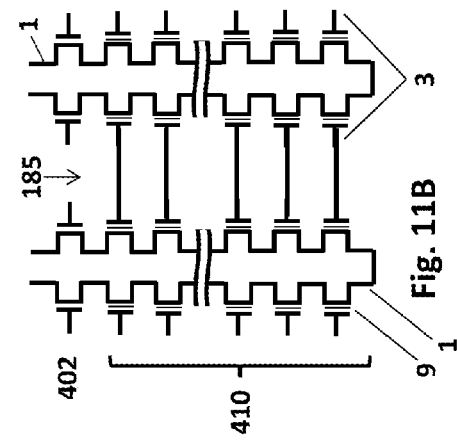

FIGS. 11A-12B illustrate why the monolithic three dimensional NAND string device embodiments discussed above can achieve a more than two fold improvement in cell density over the prior art devices. FIG. 11A illustrates a side cross sectional view and FIG. 11B is an equivalent circuit of a vertical NAND memory device according to an embodiment. In contrast, FIG. 12A illustrates a side cross sectional view and FIG. 12B is an equivalent circuit of a prior art vertical NAND memory device to that of FIG. 3. As illustrated in FIGS. 11A and 11B, the monolithic three dimensional NAND string device has two memory strings which share the same channel per memory trench 184. Another way to describe this is that there are twice as many cells per string/trench/memory hole in FIG. 11 than in FIG. 12 if the channel extending between a source and drain is considered one string. Thus, if the memory cells of the embodiment and the prior art were of the same dimensions, the device of the present embodiment would have twice as many cells or strings per unit area as the prior art device. Further, because source lines 103 are provided on every other rails 183 rather than every rail 183, the memory trenches 184 are isolated without the need to etch slit trenches 86 down to the substrate 100 as required in the prior art device illustrated in FIG. 12A.

FIGS. 13A-13F compare the effects of cell-to-cell variation caused by differential etching of a stack 120 of alternating layers of first layers 12 and second layers 3 of a prior art pillar shaped channel NAND device (FIGS. 13A-13C and a trench NAND device according to an embodiment (FIGS. 13D-13F). As illustrated in FIGS. 13A-13C, the memory cells of the prior art pillar device decrease in diameter towards the bottom of the stack 120 relative to the memory cells in the top of the stack 120. The higher the memory stack (i.e., the more alternating layers of first layers 12 and second layers 3), the larger the difference in diameter of the memory cells. The result is a significant variation of the threshold voltage of the memory cells in the string.

In contrast, as illustrated in FIGS. 13D-13F, the size of the memory cells in the trench NAND device does not vary with the depth of the memory trench 184. Therefore, the threshold voltage of the memory cells does not vary with the depth of the memory trench 184. Thus, it is easier to fabricate a trench monolithic three dimensional NAND string device than a pillar monolithic three dimensional NAND string device.

A method of making a monolithic three dimensional NAND string according to an embodiment is illustrated in FIGS. 14A-14P. The method includes providing a stack 120 of alternating first material layers 3 and second material layers 12 different from the first material layer over a substrate 100 as illustrated in FIG. 14A. Also included on the top of the stack 120 is a select gate layer 412. The method also includes etching the stack 120 to form at least one memory trench 184 in the stack 120 and separating layer 412 into source gates 402 as illustrated in FIG. 14B. Preferably, a plurality of trenches 184 are formed, thereby resulting in rail 183 shaped stacks 120 of alternating first 3 and second 12 layers extending in a first direction. Etching may be performed by first patterning a first resist or hard mask 240 deposited over the top of the stack 120.

In an embodiment, etching the stack to form the trench 184 includes etching the stack 120 to form a plurality of trenches 184 extending in a first direction. The plurality of trenches 184 are separated by a plurality of rails 183 extending in the same first direction. Further, each of the plurality of rails 183 is located between two adjacent trenches 184 and each of the plurality of rails 183 includes the stacked 120 alternating first material layers 3 and second material layers 12.

Next, a blocking dielectric 7 is formed over a side wall of the trenches 184 (i.e. on the rails 183) as illustrated in FIGS. 14C and 14D. Then a charge storage layer 9, e.g. a floating gate or charge trapping dielectric (e.g. SiN), is formed over the blocking dielectric 7 in the trenches 184 as illustrated in FIGS. 14E and 14F. Next, a tunnel dielectric 11 is formed over the charge storage layer 9 in the trenches 184 as illustrated in FIGS. 14G, 14H. Then a semiconductor channel 1 (e.g. amorphous silicon or polysilicon) is formed over the tunnel dielectric 11 in the trenches 184 as illustrated in FIGS. 14I, 14J. In an embodiment, the semiconductor channel 1 extends continuously over an upper surface of the plurality of rails 183 and over a bottom surface and side walls of the plurality of trenches 184.

Figure 14L:
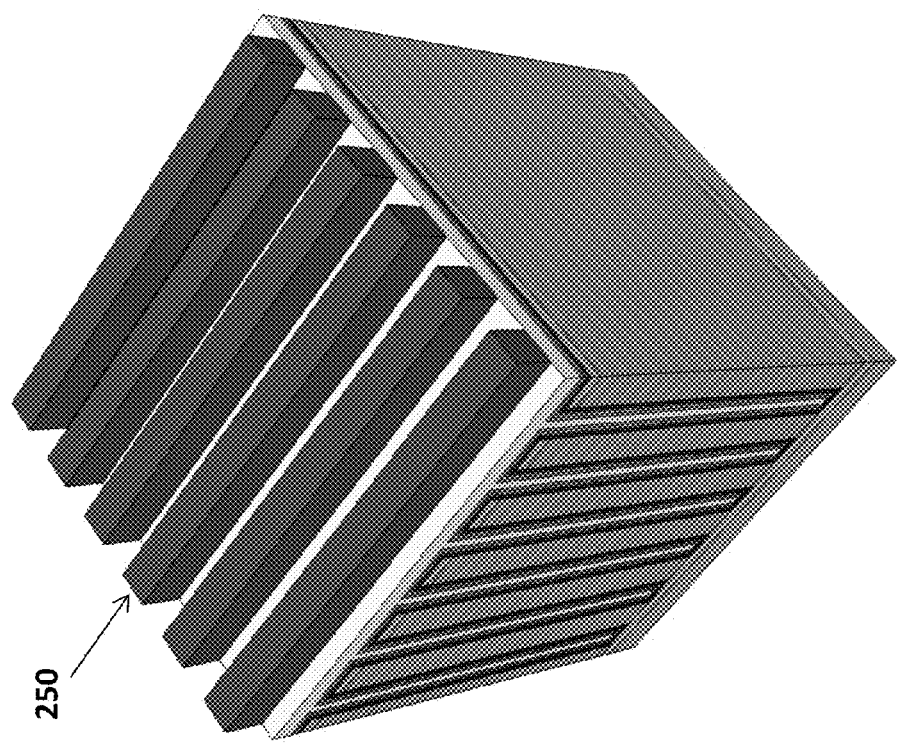
Figure 14K:
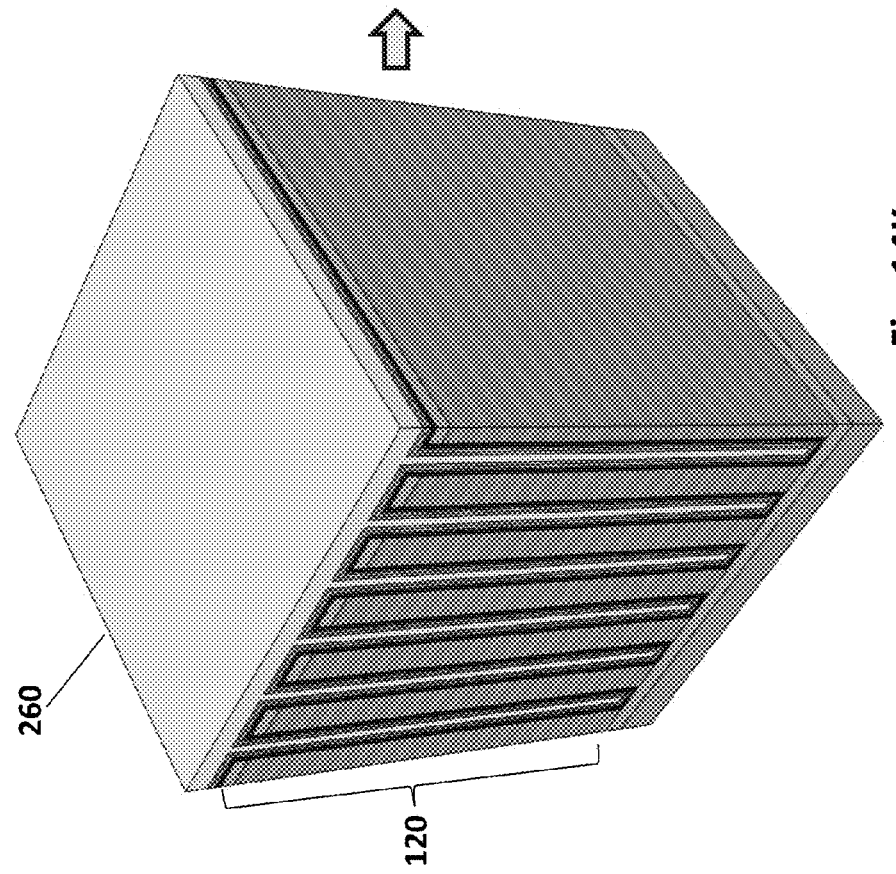

As illustrated in FIG. 14K, a sacrificial material 260 may then be deposited to fill the trenches 184 and cover the top of the rails 183. The sacrificial layer 260 may be SiO$_2$ or any other suitable sacrificial material. Next, as illustrated in FIG. 14L, a second resist or hard mask may be deposited and patterned to form mask rails 250 of second resist or hard mask over the sacrificial material 260. The mask rails 250 extend in a second direction substantially perpendicular to the first direction of the memory trenches 184 and rails 183. Then, as illustrated in FIGS. 14M and 14N, the sacrificial material 260 between the mask rails 250 is removed, such as with an anisotropic etch, to form rails of sacrificial material 260 which to expose the channel layer 1.

After removing the sacrificial material 260 between the mask rails 250, the portion of the channel layer 1 between the mask rails 250 may be removed by etching from exposed portions of the rails 183 and the trench 184 as illustrated in FIG. 14O. Alternatively, the rails 250 may be removed leaving rails of sacrificial material 260 over the channel layer 1 and then a portion of the channel layer 1 is removed using the rails of sacrificial material 260 as an etch mask.

As illustrated in FIG. 14P, the rails of sacrificial material 260 are then removed by selective etching. In another embodiment, the exposed portions of the tunnel dielectric 11 from the previous etching step in FIG. 14O are removed together with or sequentially after the channel 1, exposing portions of the underlying charge storage layer 9. The resulting structure illustrated in FIG. 14P includes a plurality of strips 25 of semiconductor channel 1 extending in the second direction perpendicular to the rails 183 of stacks 120 of alternating first 3 and second 12 layers. In an embodiment, etching the tunnel dielectric 11 and the semiconductor channel 1 forms a plurality of strips 25 extending in a second direction which is substantially perpendicular to the first direction (the direction of the rails 183).

Another embodiment includes further etching the charge storage layer 9 in the step of FIG. 14O in addition to etching the tunnel dielectric 11 and the semiconductor channel 1 to form a plurality of strips 25 extending in a second direction which is substantially perpendicular to the first direction. In this embodiment the plurality of strips 25 includes the semiconductor channel 1, the tunnel dielectric and the charge storage layer 9. If desired, the plurality of strips 25 can be etched in the step illustrated in FIG. 14O such that the strips also include the blocking dielectric 7.

An embodiment of the method also includes forming a plurality of bit lines 104 extending in the second direction and electrically contacting the channel region 1 in each of the plurality of strips 25 and forming a plurality of source lines 103 extending in the first direction above or below the plurality of strips 25 and electrically contacting the semiconductor channel 1 in each of the plurality of strips 25, as described above with respect to FIGS. 4-8B.

The method further includes etching a plurality of slit trenches 185 in each respective one of the plurality of rails 183 as shown in FIG. 4. The slit trenches 185 cut at least a first one of the first material layers (e.g. the select gate electrode 402) and the second material layers 12 in each of the plurality of rails 183. The method optionally includes filling the plurality of the slit trenches 185 with an insulating material.

In an embodiment, the first material layers comprise electrically conductive control gate layers 3 and select gate layers 402, and the second material layers 12 comprise electrically insulating layers. Additionally as shown in FIGS. 4 and 6B, the plurality of slit trenches 185, 185A are formed through at least one of an upper or lower select gate layers 402 in each respective one of the plurality of rails 183, such that the plurality of slit trenches 185, 185A do not extend through the control gate layers 3. In another embodiment, the plurality of slit trenches 185,185A are etched and filled with an insulating material prior to the step of forming the blocking dielectric 7 and the plurality of strips 25 extend continuously over the upper surface of the plurality of rails 25 containing the slit trenches 183 filled with the insulating material and over a bottom surface and side walls of the plurality of trenches 184, as shown in FIG. 4.

In another embodiment, the plurality of slit trenches 185 are etched and filled with the insulating material after to the step of forming the semiconductor channel 1 such that the plurality of slit trenches 185 extend through the plurality of strips 25 at the upper surface of the plurality of rails 183 as shown in FIGS. 7A and 7B. Further, the plurality of strips 25 contain a discontinuity comprising a respective one of the plurality of slit trenches 185 filled with the insulating material over an upper surface of the plurality of rails 183. In an embodiment, each of the plurality of bit lines 104 contacts adjacent portions of the semiconductor channel 1 separated by a respective one of the plurality of slit trenches 185 filled with the insulating material to form a conductive bridge between the adjacent portions of the semiconductor channel 1, as shown in FIG. 7B.

In an embodiment, forming the plurality of source lines 103 includes forming the plurality of source lines above the plurality of strips 25 and electrically contacting the semiconductor channel 1 (e.g. doped source regions in channel 1) in each of the plurality of strips 25 from above. In another embodiment, forming the plurality of source lines 103 includes forming the plurality of source lines 103 in or above the substrate 100 below each of the plurality of trenches 184. preferably before forming the stacks 120 and rails 183 and trenches 184. The method further includes removing the blocking dielectric 7, the charge storage layer 9, and the tunnel dielectric 11 from a bottom surface of the plurality of trenches 184 prior to forming the semiconductor channel 1, such that a bottom of the semiconductor channel 1 is formed in electrical contact with the plurality of source lines 103, as shown in FIG. 6B.

Another embodiment includes comprising forming a back gate 102 in or over the substrate 100 prior to forming the trenches 184, the rails 183 and the stacks 120 as shown in FIG. 6A. Another embodiment includes doping a bottom portion of the semiconductor channel 1 by ion implantation to form a doped region above the back gate 102. In another embodiment, the trench 184 has a bottom proximal to a major surface of the substrate 100 and a top distal to the major surface of the substrate 100 and the trench 184 is wider at the top than at the bottom. In an embodiment, the trenches 184 are etched using a partially anisotropic etch rather than a fully anisotropic etch such that the side walls of the trench 184 are tapered at an angle θ between 80 and 90 degrees relative to the major surface of the substrate 100.

FIG. 15 is a circuit diagram illustrating a read operation for a monolithic three dimensional NAND device according to an embodiment. To perform a read operation, a sufficient voltage is applied to both of the select gate electrodes 402 of the selected string 410A to turn them on and 0V is applied to the source line 103 of the selected string 410A. A discharge and sense voltage $Y_{bl}$ is applied to the bit line 104A (e.g. BL(n)) of the selected string and a read voltage is applied to the control gates 3 of the cells of the selected NAND string 410A to detect if a charge is stored in the selected memory cells 500 of the NAND string. The bit lines 104B (e.g. BL(n+1)) of other columns adjacent to the column of the selected string 410A may be maintained at any or no voltage.

Figure 16:
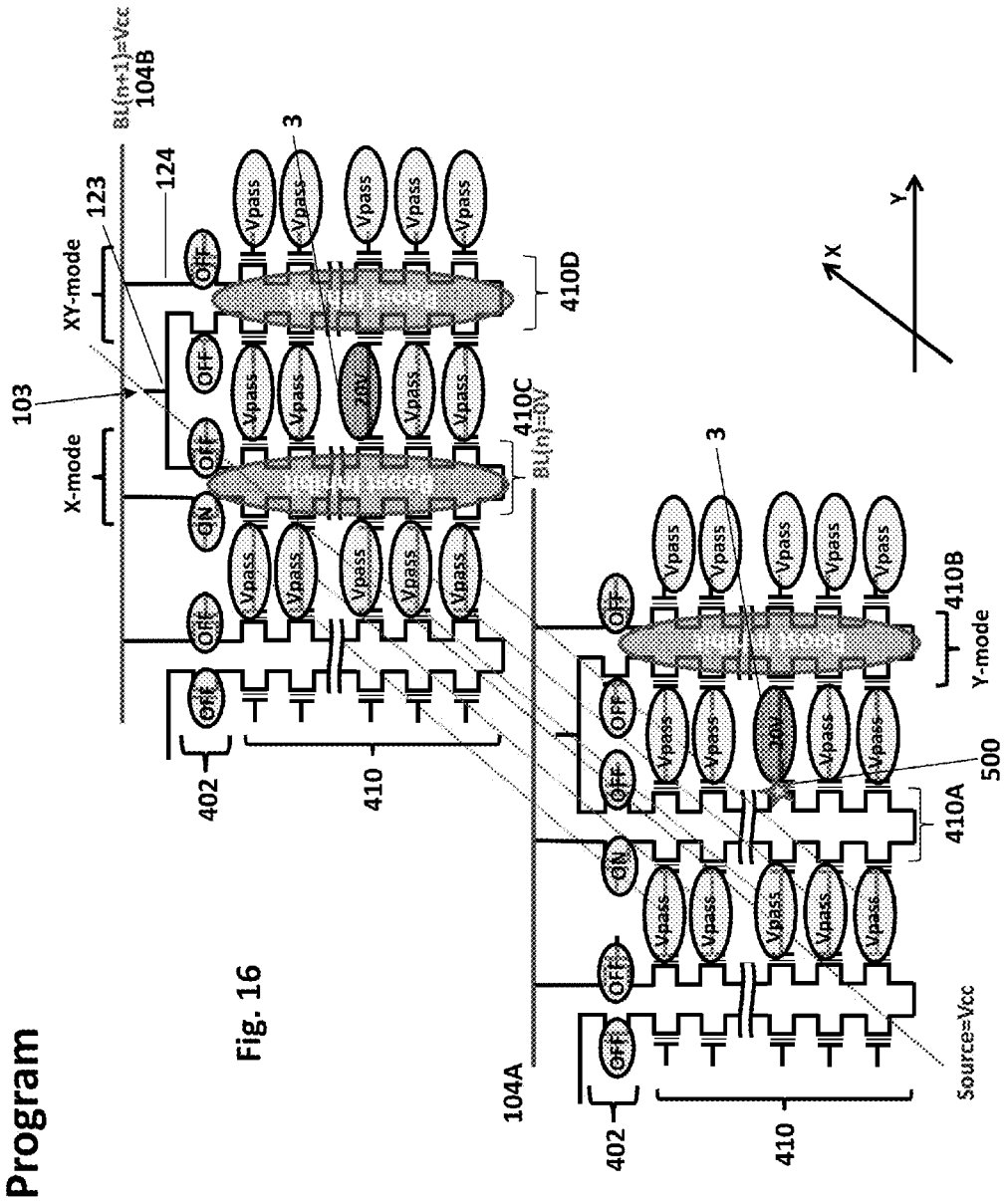
FIG. 16 is a circuit diagram illustrating a program operation for a monolithic three dimensional NAND device according to an embodiment.

FIG. 16 is a circuit diagram illustrating a program operation for a monolithic three dimensional NAND string according to an embodiment. To program the NAND string 410A, a voltage is applied to its drain side select gate electrode 402 to turn it on as illustrated in FIG. 16. In an embodiment, an inhibit voltage is applied to the gate electrodes 3 of the adjacent string 410B, 410C, 410D which share a source line 103 with the selected sting 410A, which are not to be programmed. A programming voltage, e.g. 20 V, is applied to the control gate electrode 3 of the cell 500 to be programmed. A voltage of 0V is applied to the bit line 104A of the column of strings 410 to be programmed and the remaining bit lines 104B of other columns are set to a voltage $V_{cc}$. The source line 103 of string 410A is also set to a voltage $V_{cc}$. Thus, both the strings 410C, 410D in column n+1 are set to boost inhibit while only string 410B in column n is set to boost inhibit. Thus, as illustrated in FIG. 16, charge flows from the channel 1 to the charge storage region 9 of the cell 500 to be programmed (e.g. cell 500 of string 410A in column n of the NAND device 400).

FIG. 17 is a circuit diagram illustrating an erase operation for a monolithic three dimensional NAND string according to an embodiment. As illustrated in FIG. 17, a voltage, such as 20V, is applied to the source line 103 of the row containing the string 410A having cell(s) to be erased. An erase voltage, such as 20V, is applied to the bit lines 104A, 104B. To erase the cells of a string 410A, an erase voltage which is less than the difference of the inhibit voltage minus a threshold voltage is applied to the select gates 402A of the string 410a in order to increase the channel 1 potential through gate induced drain leakage (GIDL) hole injection. The control gate electrodes 3 are kept floating or maintained at a low voltage, e.g. 0V, to cause the charge stored in the charge storage region 9 to be annihilated through hole injection from the channel 1. Optionally, a high voltage, such as 20V, can be applied to the select gate to suppress the GIDL hole injection to the channel. Then, erase operation of the cell string 410A can be inhibited.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a monolithic three dimensional NAND string, comprising:
    providing a stack of alternating first material layers and second material layers different from the first material layer over a substrate;
    etching the stack to form at least one trench in the stack;
    forming a blocking dielectric over a side wall of the at least one trench;
    forming a charge storage layer over the blocking dielectric in the at least one trench;
    forming a tunnel dielectric over the charge storage layer in the at least one trench; and forming a semiconductor channel over the tunnel dielectric in the at least one trench;
    wherein:
    etching the stack to form the at least one trench comprises etching the stack to form a plurality of trenches extending in a first direction;
    the plurality of trenches are separated by a plurality of rails extending in the first direction;
    each of the plurality of rails is located between two adjacent trenches; each of the plurality of rails comprises the stacked alternating first material layers and second material layers; and the semiconductor channel extends continuously over an upper surface of the plurality of rails and over a bottom surface and side walls of the plurality of trenches; and further comprising:

etching the semiconductor channel to form a plurality of strips extending in a second direction which is substantially perpendicular to the first direction;

filling the plurality of trenches with a sacrificial material after the step of forming the semiconductor channel and before the step of etching which forms the plurality of strips;

forming a mask comprising a plurality of strips extending in the second direction over the sacrificial layer; and etching the sacrificial material using the mask to form a plurality of sacrificial strips, wherein the step of etching to form the plurality of strips comprises etching the semiconductor channel using at least one of the mask and the sacrificial strips to form the plurality of strips; and removing the mask and the sacrificial strips.

2. A method of making a monolithic three dimensional NAND string, comprising:

providing a stack of alternating first material layers and second material layers different from the first material layer over a substrate;

etching the stack to form at least one trench in the stack;

forming a blocking dielectric over a side wall of the at least one trench;

forming a charge storage layer over the blocking dielectric in the at least one trench;

forming a tunnel dielectric over the charge storage layer in the at least one trench; and forming a semiconductor channel over the tunnel dielectric in the at least one trench;

wherein:

etching the stack to form the at least one trench comprises etching the stack to form a plurality of trenches extending in a first direction;

the plurality of trenches are separated by a plurality of rails extending in the first direction;

each of the plurality of rails is located between two adjacent trenches;

each of the plurality of rails comprises the stacked alternating first material layers and second material layers; and the semiconductor channel extends continuously over an upper surface of the plurality of rails and over a bottom surface and side walls of the plurality of trenches; and further comprising:

etching the tunnel dielectric and the semiconductor channel to form a plurality of strips extending in a second direction which is substantially perpendicular to the first direction;

filling the plurality of trenches with a sacrificial material after the step of forming the semiconductor channel and before the step of etching which forms the plurality of strips;

forming a mask comprising a plurality of strips extending in the second direction over the sacrificial layer; and etching the sacrificial material using the mask to form a plurality of sacrificial strips, wherein the step of etching to form the plurality of strips comprises etching the tunnel dielectric and the semiconductor channel using at least one of the mask and the sacrificial strips to form the plurality of strips; and removing the mask and the sacrificial strips.

3. A method of making a monolithic three dimensional NAND string, comprising:

providing a stack of alternating first material layers and second material layers different from the first material layer over a substrate;

etching the stack to form at least one trench in the stack;

forming a blocking dielectric over a side wall of the at least one trench;

forming a charge storage layer over the blocking dielectric in the at least one trench;

forming a tunnel dielectric over the charge storage layer in the at least one trench; and forming a semiconductor channel over the tunnel dielectric in the at least one trench;

wherein:

etching the stack to form the at least one trench comprises etching the stack to form a plurality of trenches extending in a first direction;

the plurality of trenches are separated by a plurality of rails extending in the first direction;

each of the plurality of rails is located between two adjacent trenches; each of the plurality of rails comprises the stacked alternating first material layers and second material layers; and the semiconductor channel extends continuously over an upper surface of the plurality of rails and over a bottom surface and side walls of the plurality of trenches; and further comprising:

etching the charge storage layer, the tunnel dielectric and the semiconductor channel to form a plurality of strips extending in a second direction which is substantially perpendicular to the first direction;

filling the plurality of trenches with a sacrificial material after the step of forming the semiconductor channel and before the step of etching which forms the plurality of strips;

forming a mask comprising a plurality of strips extending in the second direction over the sacrificial layer; and etching the sacrificial material using the mask to form a plurality of sacrificial strips, wherein the step of etching to form the plurality of strips comprises etching the charge storage layer, the tunnel dielectric and the semiconductor channel using at least one of the mask and the sacrificial strips to form the plurality of strips; and removing the mask and the sacrificial strips; further comprising:

filling the plurality of trenches with a sacrificial material after the step of forming the semiconductor channel and before the step of etching which forms the plurality of strips;

forming a mask comprising a plurality of strips extending in the second direction over the sacrificial layer; and etching the sacrificial material using the mask to form a plurality of sacrificial strips, wherein the step of etching to form the plurality of strips comprises etching the charge storage layer, the tunnel dielectric and the semiconductor channel using at least one of the mask and the sacrificial strips to form the plurality of strips; and removing the mask and the sacrificial strips.

4. A method of making a monolithic three dimensional NAND string, comprising:

providing a stack of alternating first material layers and second material layers different from the first material layer over a substrate;

etching the stack to form at least one trench in the stack;

forming a blocking dielectric over a side wall of the at least one trench;

forming a charge storage layer over the blocking dielectric in the at least one trench;

forming a tunnel dielectric over the charge storage layer in the at least one trench; and forming a semiconductor channel over the tunnel dielectric in the at least one trench;

wherein:

etching the stack to form the at least one trench comprises etching the stack to form a plurality of trenches extending in a first direction;

the plurality of trenches are separated by a plurality of rails extending in the first direction;

each of the plurality of rails is located between two adjacent trenches; each of the plurality of rails comprises the stacked alternating first material layers and second material layers; and the semiconductor channel extends continuously over an upper surface of the plurality of rails and over a bottom surface and side walls of the plurality of trenches; and further comprising:

etching the charge storage layer, the tunnel dielectric and the semiconductor channel to form a plurality of strips extending in a second direction which is substantially perpendicular to the first direction;

forming a plurality of bit lines extending in the second direction and electrically contacting the channel region in each of the plurality of strips;

forming a plurality of source lines extending in the first direction above or below the plurality of strips and electrically contacting the semiconductor channel in each of the plurality of strips;

etching a plurality of slit trenches in each respective one of the plurality of rails, the slit trenches cutting at least a first one of the first material layers and the second material layers in each of the plurality of rails; and filling the plurality of the slit trenches with an insulating material;

wherein:

the first material layers comprise electrically conductive control gate layers and select gate layers, and the second material layers comprise electrically insulating layers; and the plurality of slit trenches are formed through at least one of an upper or lower select gate layer in each respective one of the plurality of rails, such that the plurality of slit trenches do not extend through the control gate layers.

5. The method of claim 4, wherein:

the plurality of slit trenches are etched and filled with the insulating material prior to the step of forming the blocking dielectric; and the plurality of strips extend continuously over the upper surface of the plurality of rails containing the slit trenches filled with the insulating material and over a bottom surface and side walls of the plurality of trenches.

6. The method of claim 4, wherein:

the plurality of slit trenches are etched and filled with the insulating material after to the step of forming the semiconductor channel such that the plurality of slit trenches extend through the plurality of strips at the upper surface of the plurality of rails; and the plurality of strips contain a discontinuity comprising a respective one of the plurality of slit trenches filled with the insulating material over an upper surface of the plurality of rails.

7. The method of claim 6, wherein each of the plurality of bit lines contacts adjacent portions of the semiconductor channel separated by a respective one of the plurality of slit trenches filled with the insulating material to form a conductive bridge between the adjacent portions of the semiconductor channel.

* * * * *